(12) United States Patent
Lee et al.

(10) Patent No.: US 6,616,436 B1
(45) Date of Patent: Sep. 9, 2003

(54) APPARATUS FOR MANUFACTURING SEMICONDUCTOR PACKAGES

(75) Inventors: Hyung Ju Lee, Seoul (KR); Ku Sun Hong, Seoul (KR); Jae Hun Ku, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,126

(22) Filed: Oct. 13, 2000

(Under 37 CFR 1.47)

(30) Foreign Application Priority Data

Oct. 15, 1999 (KR) .......................................... 1999-44657

(51) Int. Cl.⁷ .......................... B29C 45/14; B29C 45/40
(52) U.S. Cl. ..................... 425/116; 425/125; 425/544; 425/572; 425/588; 425/444
(58) Field of Search ..................... 264/272.15, 272.17; 425/116, 125, 572, 588, 544, 556, 444

(56) References Cited

U.S. PATENT DOCUMENTS

| | | | | |
|---|---|---|---|---|
| 2,596,993 A | * | 5/1952 | Gookin | 264/275 |
| 3,734,660 A | * | 5/1973 | Davies et al. | 425/123 |
| 4,332,537 A | * | 6/1982 | Slepcevic | 425/121 |
| 4,451,224 A | * | 5/1984 | Harding | 425/548 |
| 4,530,152 A | | 7/1985 | Roche et al. | 29/588 |
| 5,041,902 A | | 8/1991 | McShane | 357/79 |
| 5,059,379 A | * | 10/1991 | Tsutsumi et al. | 264/272.14 |
| 5,157,480 A | | 10/1992 | McShane et al. | 357/74 |
| 5,172,213 A | | 12/1992 | Zimmerman | 257/796 |
| 5,172,214 A | | 12/1992 | Casto | 257/676 |
| 5,278,446 A | | 1/1994 | Nagaraj et al. | 257/707 |
| 5,428,248 A | | 6/1995 | Cha | 257/676 |
| 5,484,274 A | * | 1/1996 | Neu | 425/116 |
| 5,521,429 A | | 5/1996 | Aono et al. | 257/676 |
| 5,701,034 A | | 12/1997 | Marrs | 257/706 |
| 5,783,861 A | | 7/1998 | Son | 253/693 |

(List continued on next page.)

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

*Primary Examiner*—Robert Davis
(74) *Attorney, Agent, or Firm*—Stetina Brunda Garred & Brucker

(57) ABSTRACT

A mold for manufacturing semiconductor packages, which allows leadframes to be easily separated from a top mold section after a molding process by utilizing eject pins therein. The mold includes a bottom mold section having housing parts on the upper surface so as to allow leadframes to be placed in a flat state therein, and a top mold formed with transports therethrough. The top mold also incorporates runners formed along a lower surface with connections to the transports to introduce encapsulation material into select regions. A plurality of gates and cavities for molding the semiconductor packages are in flow communication. The eject pins are reciprocally mounted in the top mold section contiguous with the runners thereof to facilitate separation of the leadframes from the top mold.

10 Claims, 6 Drawing Sheets

U.S. PATENT DOCUMENTS

| | | | |
|---|---|---|---|
| 5,835,988 A | 11/1998 | Ishii | 257/684 |
| 5,866,939 A | 2/1999 | Shin et al. | 257/666 |
| 5,871,782 A * | 2/1999 | Choi | 425/116 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A | 11/2000 | Glenn | 174/52.4 |
| 6,229,200 B1 | 5/2001 | Mclellan et al. | 257/666 |
| 6,242,281 B1 | 6/2001 | Mclellan | 438/106 |
| 6,294,100 B1 | 9/2001 | Fan et al. | 216/14 |
| 6,355,502 B1 | 3/2002 | Kang et al. | 438/110 |

\* cited by examiner

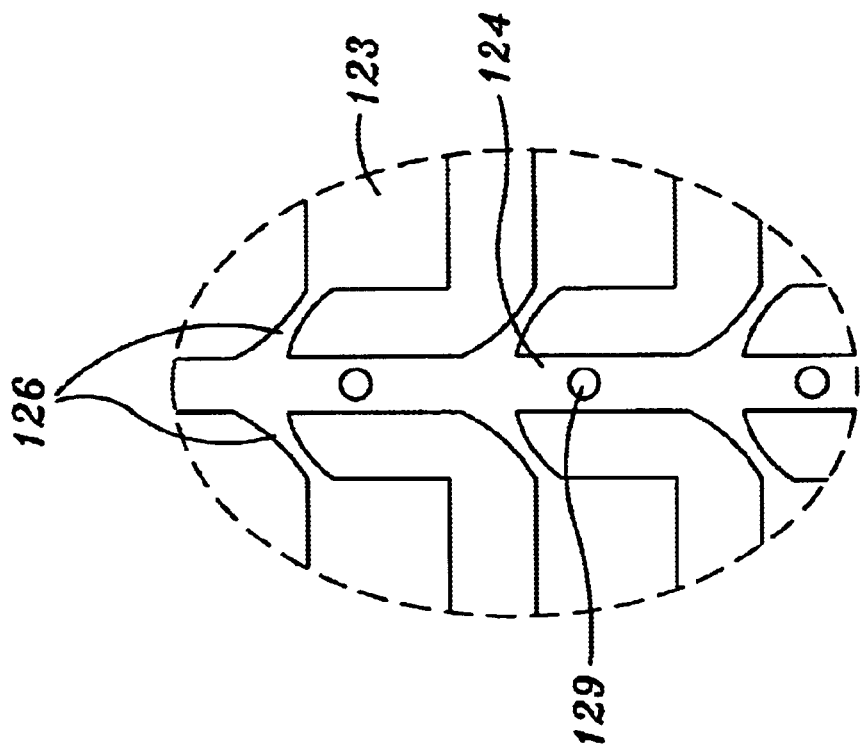
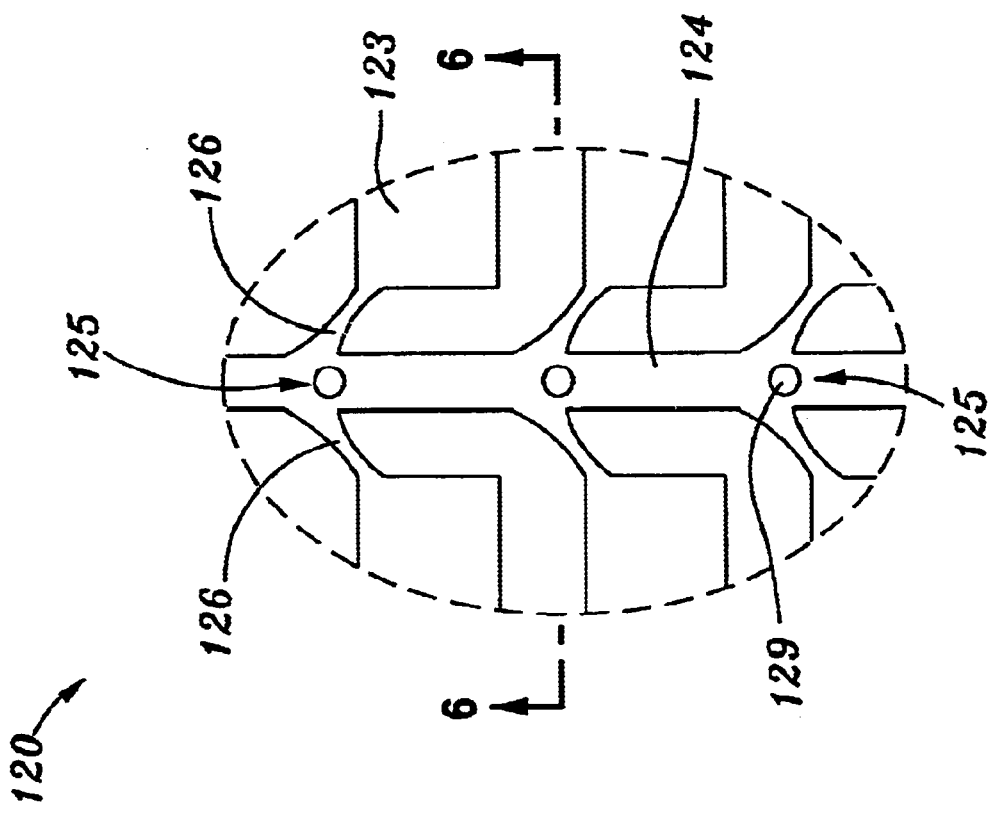

APPARATUS FOR MANUFACTURING SEMICONDUCTOR PACKAGES

BACKGROUND OF THE INVENTION

1. Field of the Invention

The present invention relates to a method of and apparatus for manufacturing semiconductor packages, and more particularly, but not by way of limitation, to a mold assembly for manufacturing semiconductor packages which allows leadframes to be easily separated from a top mold section after a molding process.

2. History of Related Art

It is conventional in the electronic industry to encapsulate one or more semiconductor devices, such as integrated circuit chips, in a semiconductor package. These plastic packages protect a chip from environmental hazards, and provide means for electrically and mechanically attaching the chip to an intended device. Recently, such semiconductor packages have included metal leadframes for supporting an integrated circuit die which is bonded to a chip paddle region thereof Bond wires which electrically connect pads on the integrated circuit die to individual leads of the leadframe are then incorporated. A hard plastic encapsulant material which covers the bond wire, the integrated circuit die and other components, forms the exterior of the package. A primary focus in this design is to provide the die with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are used to connect the package externally. More information relative to leadframe technology may be found in Chapter 8 of the book *Micro Electronics Packaging Handbook*, (1989), edited by R. Tummula and E. Rymaszewski. This book is published by Van Nostrand Reinhold, 115 Fifth Avenue, New York, N.Y.

Once the integrated circuit dies or chips have been produced and encapsulated in a semiconductor package described above, they may be used in a variety of electronic appliances. A wide variety of electronic devices have been developed in recent years, such as cellular phones, portable computers, etc. Each of these devices typically includes a motherboard on which a significant number of such semiconductor packages are secured to, provide multiple electronic functions. These electronic appliances are themselves required to be reduced in size as consumer demand increases. Accordingly, not only are semiconductor chips highly integrated, but also semiconductor packages are miniaturized with a high increase of package mounting density.

According to such miniaturization tendency, semiconductor packages, which transmit electrical signals from semiconductor chips to motherboards and support the semiconductor chips on the motherboards, have been designed to have a size of about 1×1 mm to 10×10 mm.

Aspects of the above-referenced manufacturing steps are set forth and shown in FIGS. 1 and 2, which are now referenced in combination. During the encapsulating step for constructing the semiconductor package as shown in FIG. 1, a plate-configuration bottom mold 10 is constructed with housing parts 12. The housing parts 12 are sunken to a predetermined depth from the upper surface 13 of the bottom mold 10 so as to allow the leadframe 30 (shown in FIG. 2) to be firmly placed thereon during encapsulation. The housing parts 12 are provided with a plurality of fixing pins 14 which are inserted into and fix the guide pinholes 29 formed in the leadframe 30 (shown in FIG. 2).

Still referring to FIG. 1, a top mold 20 is shown above bottom mold 10. The top mold 20 is also of a plate configuration, having a plurality of transports 22 which perforate the top mold 20 in the vertical direction. In the top mold 20, a runner 24 is grooved to a depth with a connection to each of the transports 22. Forming a tree-like configuration, a plurality of gates 26 are also grooved to a depth with connections to the runner 24. At the terminus of each of the gates 26 is formed a cavity 28 in which the package body 32 of the semiconductor package will be formed, as described in more detail below.

In operation, the bottom mold 10 and top mold 20 are used to encapsulate an assembled leadframe 30 placed therebetween. First, the leadframe 30 is safely placed on the housing parts 12 of the bottom mold 10. At this time, the guide pinholes 29 formed in the leadframe 30 are engaged with the fixing pins 14 formed in housing parts 12 to accurately fix the leadframe 30 (shown in FIG. 2). The top mold 20 is then clamped to the bottom mold 10. An amount of an encapsulation material is then introduced into the transports and pressurized with a transfer ram (not shown) to flow the encapsulation material through the runners 24 and the gates 26 into the cavities 28, described above.

Referring now to FIG. 2, following the filling of the encapsulation material between the bottom mold 10 and top mold 20 housing the leadframe 30, the top mold 20 is taken off, after which the leadframe 30 is removed out of the bottom mold 10 and subjected to the next process. In FIG. 2, there is shown the leadframe 30 after the encapsulation is completed on the bottom mold 10. It is conventional in the art to maintain the top mold 20 and the bottom mold 10 at such a predetermined temperature that the encapsulation material can smoothly flow through the runners 24 and the gates 26 to the cavities 28. After completion of the encapsulation, dregs of the encapsulation material which remain on the bottom mold 10 and the leadframe 30, that is, a transport curl 42, a runner curl 44 and a gate curl 46 are all removed.

After completion of the encapsulation, when the top mold is separated from the bottom mold, the leadframe frequently remains adhered to the top mold on account of the high adhesiveness of the encapsulation material. It is at this point that forcible secession by the hand of an operator can cause the breakage or bending of the leadframe. This aspect of the production process is a distinct disadvantage and is addressed by the present invention.

BRIEF SUMMARY OF THE INVENTION

The present invention relates to a method of and apparatus for manufacturing semiconductor packages. More particularly, one aspect of the present invention includes a mold for manufacturing semiconductor packages, which allows leadframes to be easily separated from its top mold after a molding process. In another aspect, the present invention includes a mold for manufacturing semiconductor packages comprising a bottom mold having housing parts on the upper surface so as to allow leadframes to be placed in a flat state therein, and a top mold comprising transports perforating through the top mold in the vertical direction; runners formed at its lower surface with connections to the transports so as to introduce an encapsulation material into targets; a plurality of gates connected to the runner; and a volume of a cavity at the terminus of each of the gates, in which a package body is to be formed. A plurality of eject pins are mounted in the top mold for reciprocating into and out of the runners, thereby easily separating the leadframes from the top mold when the pins are actuated and move into the runners.

In a further aspect of the present invention, the above described invention includes eject pins formed at the intersections between the runners and the gates. Moreover, in the mold of the present invention, the runner curl which is most strongly stuck to the top mold can be pushed out downwardly by use of the eject pins so as to easily separate the leadframe from the top mold.

In yet another aspect of the present invention, a method of manufacturing a packaged semiconductor is presented. The method of making the packaged semiconductor includes the steps of providing a mold for manufacturing a packaged semiconductor upon a leadframe. The leadframe is of the type having a chip paddle formed therein and upon which a semiconductor chip is secured thereon. Input/output pads of the semiconductor chip are electrically connected to leads of the leadframe via wires. The semiconductor chip and leadframe assembly as above described are then secured within the mold. Encapsulant is then injected into the mold to form a semiconductor package body. The mold is separated, and the leadframes easily separated from the top mold portion after the molding process by the utilization of eject pins reciprocally mounted within the top mold in the grooved runner thereof for applying a uniform pressure across and easily separating the leadframe from the top mold.

BRIEF DESCRIPTION OF THE DRAWINGS

A more complete understanding of the method and apparatus of the present invention may be obtained by reference to the following detailed description, with like reference numerals denoting like elements, when taken in conjunction with the accompanying drawings wherein:

FIG. 4 is a fragmentary, enlarged plan view of a part A of FIG. 3 illustrating the positions of the eject pins within the top mold;

FIG. 5 is an alternative embodiment of the invention shown in FIG. 4 illustrating a different placement of the eject pins in accordance with the principles of the present invention;

DETAILED DESCRIPTION OF THE INVENTION

Figure 1:
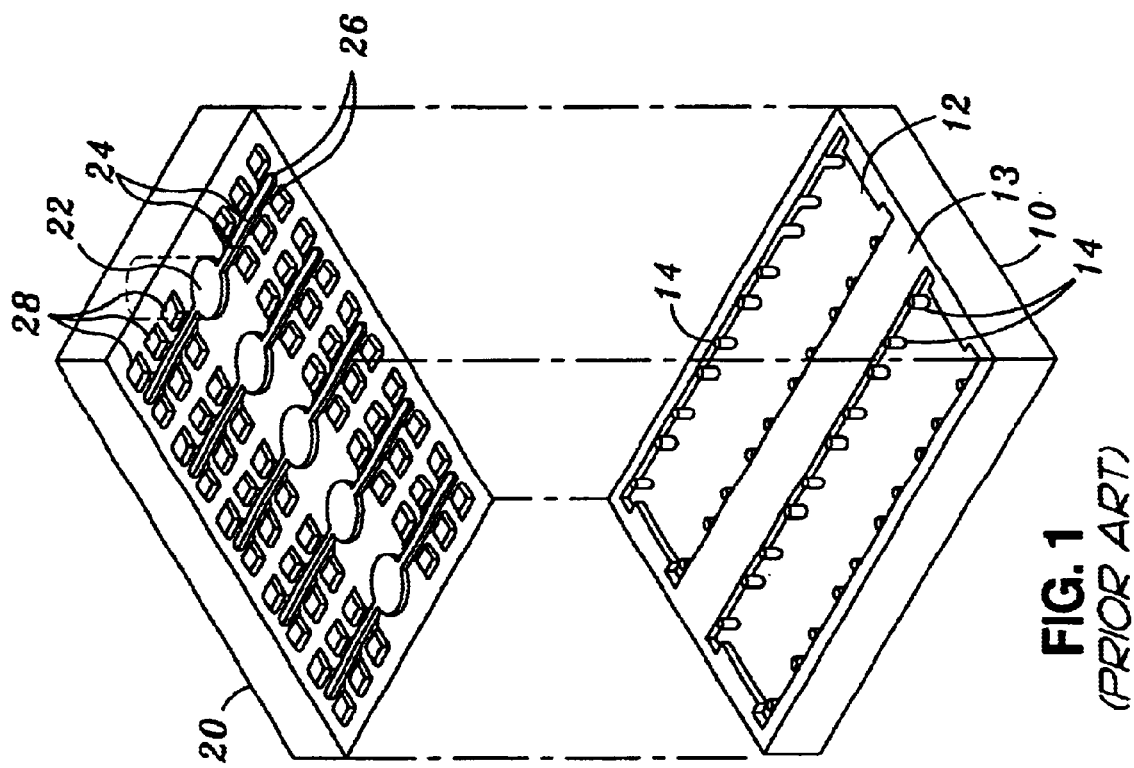
FIG. 1 is a perspective view showing top and bottom molds of conventional design for manufacturing semiconductor packages.
Figure 2:
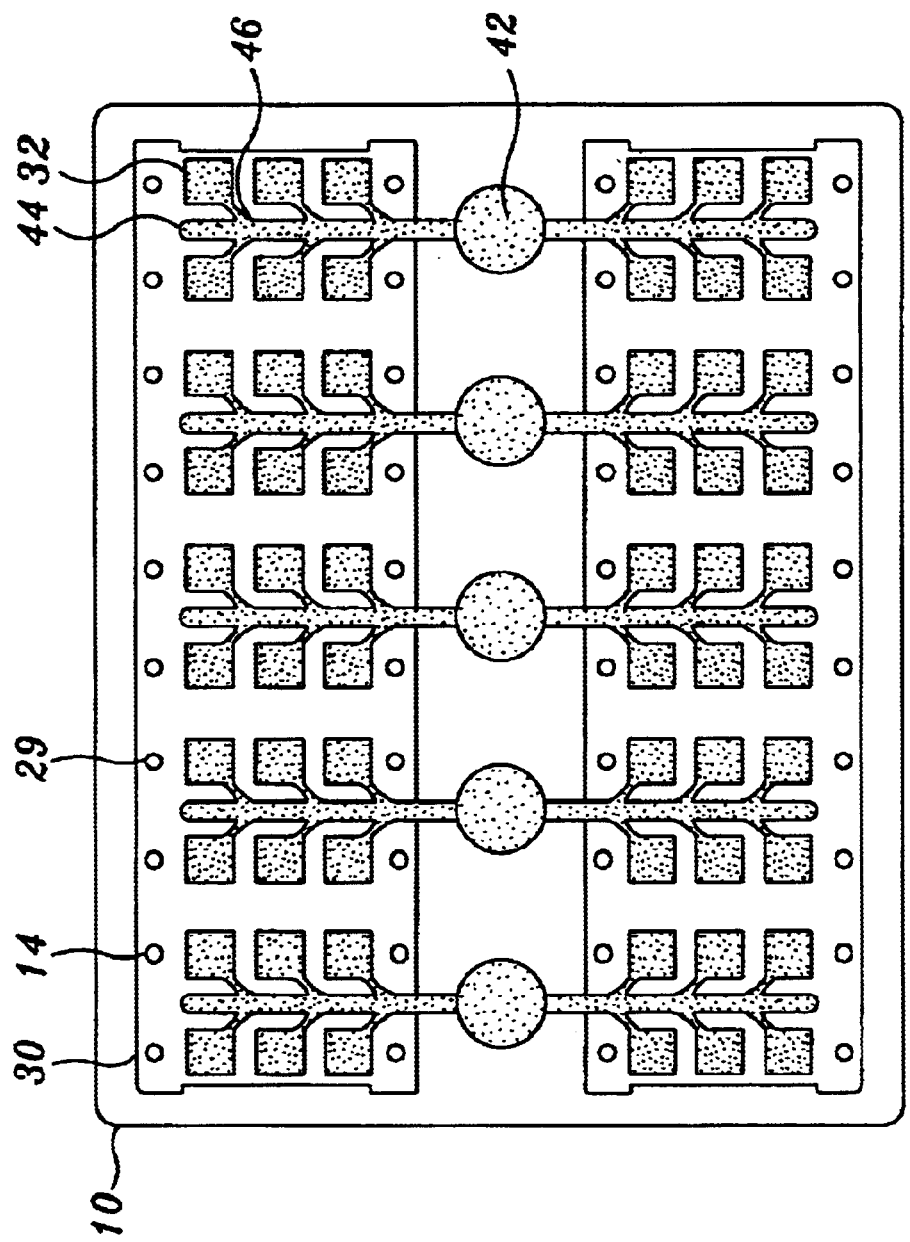
FIG. 2 is an enlarged bottom plan view of the bottom mold of FIG. 1 showing a leadframe positioned on the bottom mold after removing the top mold, and its encapsulation of semiconductor chips mounted to the leadframe.
Figure 3:
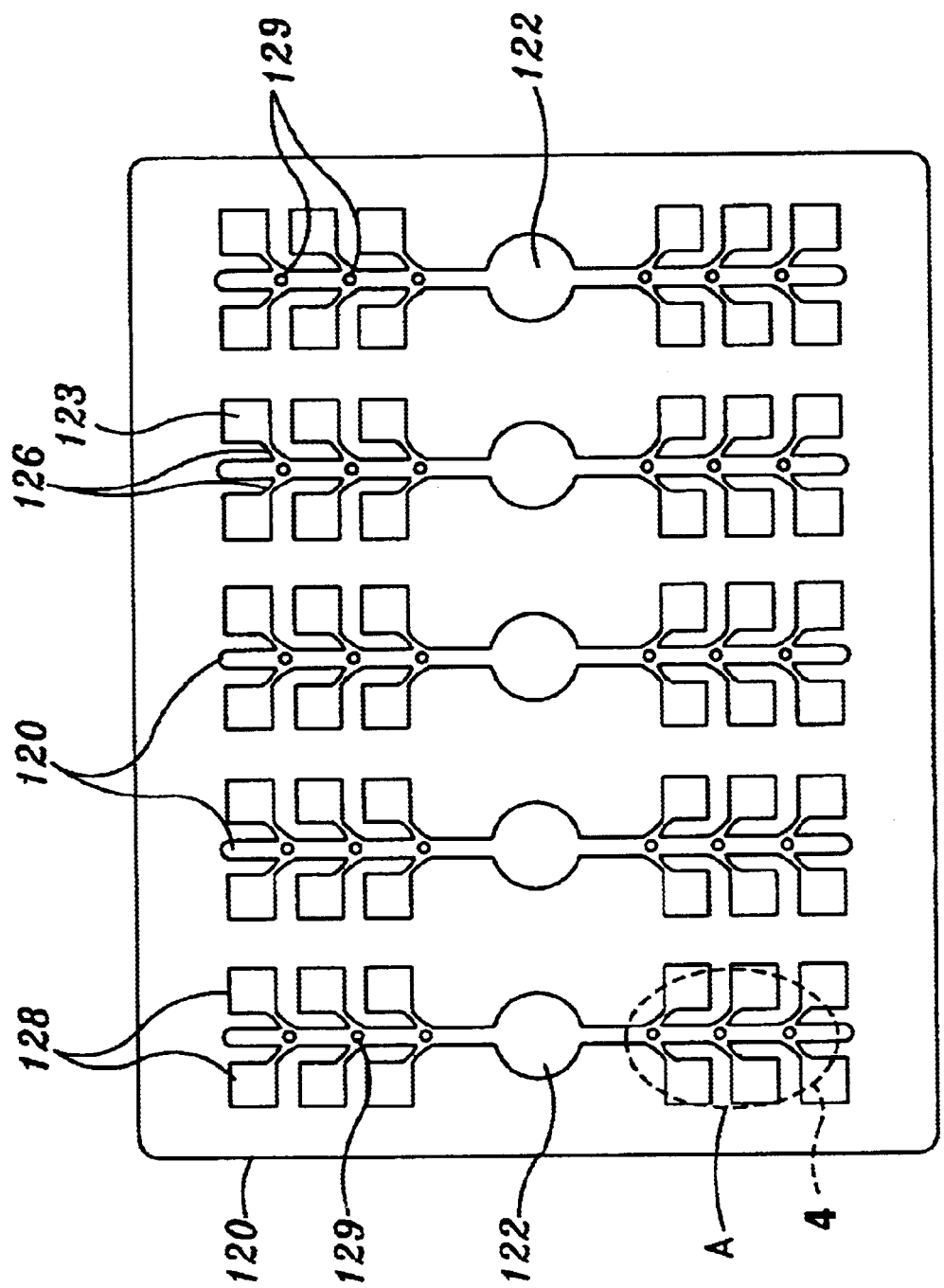
FIG. 3 is a plan view showing the underside of a top mold for manufacturing semiconductor packages, in accordance with the principles of the present invention.

Referring first to FIG. 3, there is shown a plan view of the underside of a top mold 120 of an embodiment of the present invention. The top mold 120 is of a plate configuration and is fabricated with a plurality of transports 122 which perforate the top mold in the vertical direction. In the top mold 120, a plurality of runners 124 are also shown to be grooved to a depth with connections to the transports 122 so as to introduce an encapsulation material into targets. A plurality of gates 126 are also grooved to a depth with connections to the runners 124. At the terminus of each of the gates 126 is formed a cavity 123 in which a semiconductor package 210 will be formed around a semiconductor chip 202 (shown in FIG. 7). A plurality of reciprocating eject pins 129 are provided for introduction into the runners 124. The eject pins 129 are formed to move downwardly and upwardly. These eject pins are constructed and placed in top mold 120 to eject the curl formed on the runner 124 so as to easily separate the leadframe from the top mold 120. This is a marked advantage over prior art techniques and reduces breakage by providing a substantially even distribution of forces along the runners 124.

Referring now to FIG. 4, there is shown a fragmentary, enlarged plan view of a part A of FIG. 3 illustrating the positions of the reciprocating eject pins 129 within the top mold 120. It is preferable in one embodiment of the invention to install the eject pins 129 at the intersections 125 between the runners 124 and the gates 126, as shown in FIG. 4. The reason is that the volume of the curl is the largest at the intersections between the runner 124 and the gate 126 and thus, the consistency of the curl is the strongest at those areas. If the curl on the intersections between the runner 124 and the gates 126 is pushed by use of the eject pins 129, the leadframe is relatively easily separated from the top mold 120.

Referring now to FIG. 5, there is shown an alternative embodiment of the present invention. The eject pins 129 may be provided in a variety of positions along the runner 124, as shown therein. The position of the eject pins 129 may thus vary and other patterns may be utilized in accordance with the present invention.

Figure 6:
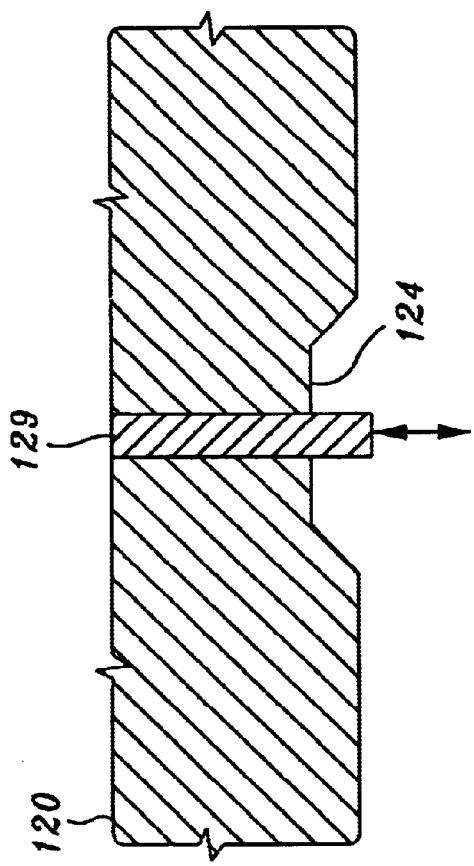
FIG. 6 is an enlarged cross-section of the top mold region shown in FIG. 4, taken along lines 6—6 thereof.

Referring now to FIG. 6, there is shown an enlarged cross-section, taken along the line 6—6 of FIG. 4. As seen therein, the eject pins 129 can move upwardly and downwardly in the runner 124 of the top mold 120. Hence, during the molding process, the ends of the eject pins 129 are positioned in the same plane with the surface of the runner 124. After completion of the molding process, the encapsulant hardens and leaves curl formed beneath the runner 124. The curl is pushed off by use of the eject pins 129, so that the leadframe is easily separated from the top mold 120. As described hereinbefore, in the mold assembly of the present invention, the runner curl which is most strongly stuck to the top mold 120 can be pushed off downwardly by use of the eject pins 129 so that the leadframe can be easily separated from the top mold 120 without being bent or warped.

Figure 7:
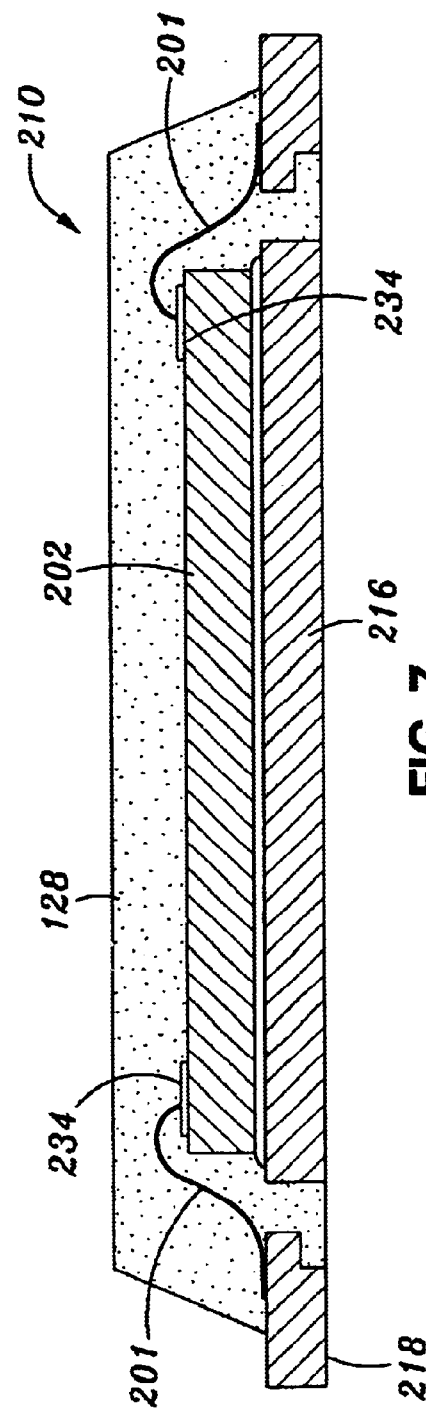
FIG. 7 is an enlarged cross-section of a packaged semiconductor singulated from a leadframe assembly after the molding process.

Referring now to FIG. 7, there is shown an enlarged cross-section of a packaged semiconductor for purposes of illustrating aspects of the molded semiconductor package of the present invention. The packaged semiconductor shown herein comprises the subject matter of co-pending U.S.

patent application Ser. No. 09/687,541 assigned to the assignee of the present invention, filed on Oct. 13, 2000, and further referenced below. It may be seen in FIG. 7 that a semiconductor chip 202 is mounted upon a chip paddle 216 forming a portion of a leadframe. In this particular view, the semiconductor chip 202 has been encapsulated by encapsulant 128 and singulated from the leadframe, The singulated leadframe package or semiconductor package 210 is constructed with a plurality of wires 201 connecting internal leads 218 of the leadframe to input/output pads 234 of the semiconductor chip 202. This illustration is of a particular embodiment of a semiconductor package assembly and is set forth and shown for purposes of illustration in accordance with the principles of the present invention wherein a bottom mold 110 and top mold 120 (shown in FIG. 8), as set forth herein, may be used to fabricate a plurality of semiconductor packages in a simultaneous operation.

Figure 8:
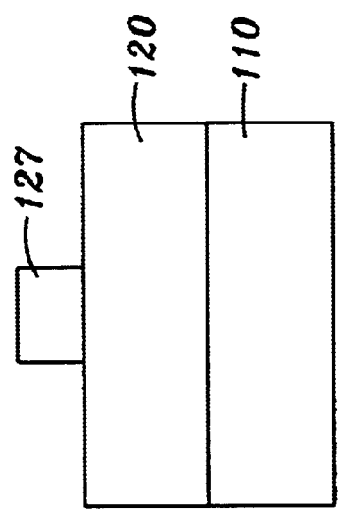
FIG. 8 is a diagrammatic schematic of one embodiment of a top and bottom mold assembly constructed in accordance with the principles of the present invention and illustrating the securement of a leadframe therein for the encapsulation thereof.

Referring now to FIG. 8, there is shown a diagrammatic illustration of a top mold 120 engaging a bottom mold 110 for the encapsulation of a leadframe disposed therein The placement of eject pins 129 is not shown herein, but actuator 127 is shown disposed above the top mold 120. The method of and apparatus for installing and actuating the eject pins 129 is not otherwise set forth and shown. One of ordinary skill in the art would readily understand that various actuating mechanisms are possible. The present actuator 127 is shown in diagrammatic form only for purposes of illustration.

Figure 9:
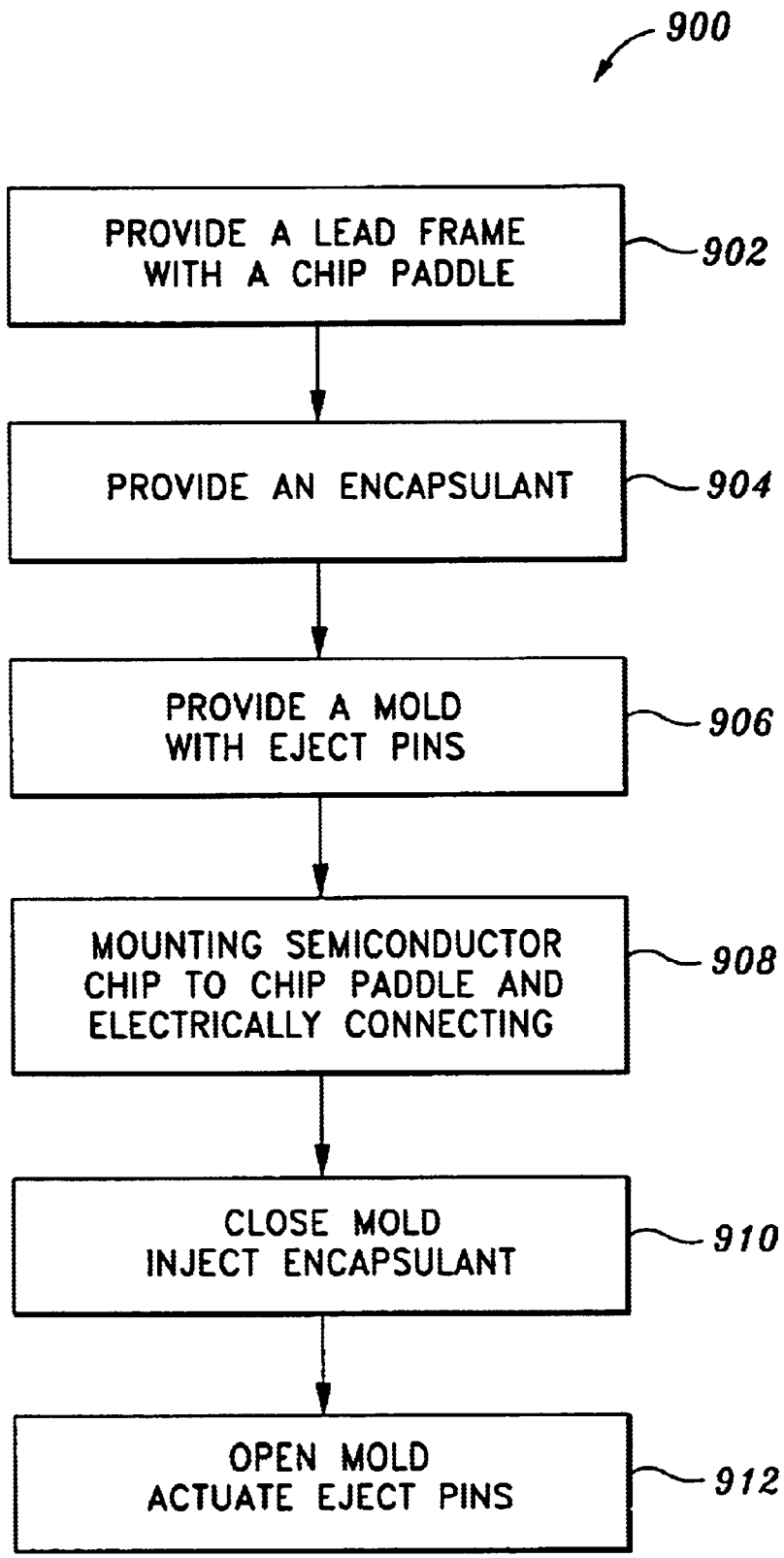
FIG. 9 is a flow diagram illustrating the steps of manufacturing the semiconductor package in accordance with the principles of the present invention.

Referring now to FIG. 9, there is shown a flow diagram illustrating a method 900 of manufacturing semiconductor packages in accordance with the principles of the present invention. In accordance with the aforesaid method, at step 902, a leadframe is provided with a chip paddle for the mounting of a semiconductor chip thereon. An encapsulant is provided for encapsulating the semiconductor chip upon the chip paddle of the leadframe within a mold at step 904. The encapsulant can be thermoplastics or thermoset resins, with thermoresins including silicones, phenolics, and epoxies. At step 906, a mold is next provided with a plurality of eject pins formed in the upper region thereof along runners formed therein. In one preferred embodiment of the present invention, the eject pins are spaced evenly along sections of the runners for facilitating the application of uniform force thereacross upon the actuation thereof Referring still to FIG. 9, the semiconductor chip is then, at step 908, secured to the chip paddle, and it is also electrically connected to portions of the leadframe extending therearound. At step 910, the mold is closed and an encapsulant is injected therein to form packaged semiconductors. At step 912, the mold is then separated and the eject pins are actuated to push off the curl formed beneath the runners so that the leadframe is easily separated from the top mold in accordance with the principles of the present invention. Utilizing this method, the mold assembly of the present invention facilitates the runner curl, which is most strongly stuck onto the top mold being easily pushed off downwardly by the use of the eject pins which reciprocate therein. This actuation allows the leadframe to be easily separated from the top mold without being bent or warped. The subsequent step of singulation which permits individual packaged semiconductors as set forth and shown in FIG. 7 to be produced is thereby greatly facilitated.

The following applications are all being filed on the same date as the present application and all are incorporated by reference as if wholly rewritten entirely herein, including any additional matter incorporated by reference therein:

| Application Number | Title of Application | First Named Inventor |
| --- | --- | --- |
| 09/687,485 | Semiconductor Package Having Increased Solder Joint Strength | Kil Chin Lee |
| 09/687,487 | Clamp and Heat Block Assembly for Wire Bonding a Semiconductor Package Assembly | Young Suk Chung |
| 09/687,876 | Near Chip Size Semiconductor Package | Sean Timothy Crowley |
| 09/687,495 | Semiconductor Package | Sean Timothy Crowley |
| 09/687,531 | Stackable Semiconductor Package and Method for Manufacturing Same | Sean Timothy Crowley |
| 09/687,530 | Stackable Semiconductor Package and Method for Manufacturing Same | Jun Young Yang |
| 09/687,493 | Semiconductor Package Having Improved Adhesiveness and Ground Bonding | Sung Sik Jang |
| 09/687,541 | Semiconductor Package Leadframe Assembly and Method of Manufacture | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A mold for encapsulating at least portions of semiconductor chips and corresponding leadframes placed therein, the mold comprising:
    a bottom mold section sized and configured to accommodate the positioning of the leadframes thereon;
    a top mold section releasably engageable to the bottom mold section, the top mold section having at least one transport formed therethrough and defining a lower surface, the top mold section further including:
        at least one grooved runner formed in the lower surface and fluidly communicating with the transport;
        a plurality of gates formed in the lower surface and fluidly communicating with the runner, the gates being arranged in pairs, with the gates of each pair extending in opposed relation to each other and communicating with the runner at an intersection;
        a plurality of cavities formed in the lower surface and fluidly communicating with respective ones of the gates, each of the cavities being sized and configured to form a package body on one of the leadframes and one of the corresponding semiconductor chips upon the introduction of an encapsulation material thereinto; and
        a plurality of eject pins reciprocally mounted to the top mold section and positioned within the runners at respective ones of the intersections.

2. The mold of claim 1 wherein each of the eject pins comprises a generally cylindrical member which is reciprocally mounted to the top mold section.

3. The mold of claim 1 wherein the eject pins are reciprocally mounted to the top mold section in a manner allowing for the simultaneous actuation thereof.

4. The mold of claim 1 wherein:
    a plurality of transports is formed within the top mold section; and
    a plurality of runners is formed in the lower surface of the top mold section, each of the runners being in fluid communication with a respective one of the transports.

5. The mold of claim 4 wherein each of the runners includes multiple pairs of the gates fluidly connected thereto.

6. A top mold section for use in encapsulating at least portions of semiconductor chips and corresponding leadframes, the top mold section including:

at least one transport formed therethrough;

at least one grooved runner formed therein and fluidly communicating with the transport;

a plurality of gates formed therein and fluidly connected to the runner, the gates being arranged in pairs, with the gates of each pair extending in opposed relation to each other and communicating with the runner at an intersection;

a plurality of cavities formed therein and fluidly communicating with respective ones of the gates, each of the cavities being sized and configured to form a package body on one of the leadframes and one of the corresponding semiconductor chips upon the introduction of an encapsulation material thereinto; and a plurality of eject pins reciprocally mounted thereto and positioned within the runners at respective ones of the intersections.

7. The top mold section of claim 6 wherein each of the eject pins comprises a generally cylindrical member which is reciprocally mounted to the top mold section.

8. The top mold section of claim 6 wherein the eject pins are reciprocally mounted to the top mold section in a manner allowing for the simultaneous actuation thereof.

9. The top mold section of claim 6 wherein:

a plurality of transports is formed within the top mold section; and a plurality of runners is formed in the top mold section, each of the runners being in fluid communication with a respective one of the transports.

10. The top mold section of claim 9 wherein each of the runners includes multiple pairs of the gates fluidly connected thereto.

* * * * *